United States Patent
Fleckenstein et al.

(10) Patent No.: US 11,422,184 B1
(45) Date of Patent: Aug. 23, 2022

(54) MULTI-DIE DEBUG STOP CLOCK TRIGGER

(71) Applicant: Apple Inc., Cupertino, CA (US)

(72) Inventors: Charles J. Fleckenstein, Portland, OR (US); Tal Lazmi, Herzliya (IL); Ori Isachar, Herzliya (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/230,443

(22) Filed: Apr. 14, 2021

(51) Int. Cl.
*G01R 31/28* (2006.01)
*G01R 31/317* (2006.01)
*G01R 31/3183* (2006.01)
*G01R 31/319* (2006.01)

(52) U.S. Cl.
CPC . *G01R 31/31705* (2013.01); *G01R 31/31725* (2013.01); *G01R 31/31727* (2013.01); *G01R 31/31924* (2013.01); *G01R 31/318314* (2013.01)

(58) Field of Classification Search
CPC ........ G01R 31/31705; G01R 31/31725; G01R 31/31727; G01R 31/318314; G01R 31/31924
See application file for complete search history.

(56) References Cited

U.S. PATENT DOCUMENTS

| 5,710,911 | A | 1/1998 | Walsh et al. |
| 8,683,265 | B2 | 3/2014 | Rentschler et al. |
| 9,037,911 | B2 | 5/2015 | Rentschler et al. |
| 9,720,438 | B2 | 8/2017 | Lee et al. |
| 2012/0150474 | A1 | 6/2012 | Rentschler et al. |
| 2014/0013172 | A1* | 1/2014 | Hopkins ............... G06F 11/263 714/724 |
| 2014/0053036 | A1* | 2/2014 | Nixon ............... G01R 31/31705 714/E11.155 |
| 2021/0141407 | A1* | 5/2021 | Lai ......................... G06F 1/324 |

FOREIGN PATENT DOCUMENTS

| CN | 104133367 B | 2/2017 |
| DE | 19720804 A1 | 12/1997 |
| JP | 2003140923 A | 5/2003 |

* cited by examiner

*Primary Examiner* — Christine T. Tu
(74) *Attorney, Agent, or Firm* — Kowert Hood Munyon Rankin and Goetzel PC; Rory D. Rankin

(57) ABSTRACT

Systems, apparatuses, and methods for implementing a multi-die clock stop trigger are described. A computing system includes a plurality of semiconductor dies connected together and sharing a global clock stop trigger signal which is pulled high via a resistor tied to a supply voltage. Each semiconductor die has a clock generation unit which generates local clocks for the die. Each clock generation unit monitors for local clock stop triggers, and if one of the local triggers is detected, the clock generation unit stops local clocks on the die and pulls the global clock stop trigger signal low. When the other clock generation units on the other semiconductor dies detect the global clock stop trigger at the logic low level, these clock generation units also stop their local clocks. Captured data is then retrieved from the computing system for further analysis.

20 Claims, 7 Drawing Sheets

MULTI-DIE DEBUG STOP CLOCK TRIGGER

BACKGROUND

Technical Field

Embodiments described herein relate to the field of computing systems and, more particularly, to synchronizing a triggered clock stop among multiple separate interconnected semiconductor dies.

Description of the Related Art

Triggered clock stop is a typical state capture capability following a specific error or trigger event. For a system on chip (SOC), the faster the SOC's clocks are stopped, the better the chance for the scan dump or memory dump state to contain relevant information that can be used to debug the problem. For multiple semiconductor dies, the ability to stop the clocks across all of the separate dies in a timely manner can be challenging.

SUMMARY

Systems, apparatuses, and methods for implementing a multi-die clock stop trigger are contemplated. In one embodiment, a computing system includes a plurality of semiconductor dies connected together and sharing a global clock stop trigger signal which is pulled high via a resistor tied to a supply voltage. Each semiconductor die has a clock generation unit which generates local clocks for the die. Each clock generation unit monitors for local clock stop triggers, and if one of the local triggers is detected, the clock generation unit stops local clocks on the die and pulls the global clock stop trigger signal low. When the other clock generation units on the other semiconductor dies detect the global clock stop trigger at the logic low level, these clock generation units also stop their local clocks. Captured state information is then retrieved from the computing system for further analysis.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

Figure 1:
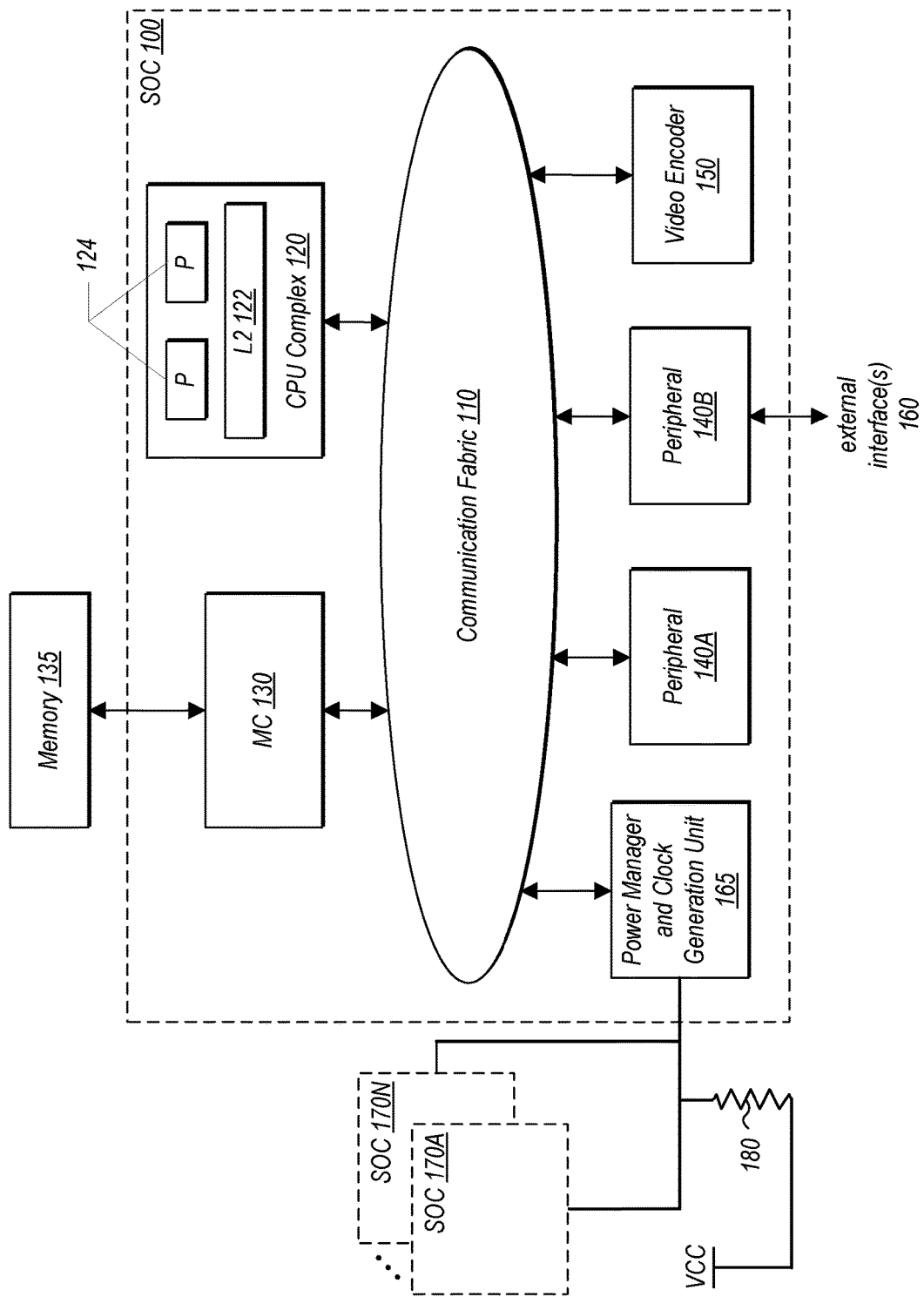
FIG. 1 is a generalized block diagram of one embodiment of multiple SOCs.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Referring now to FIG. 1, a block diagram of one embodiment of multiple systems-on-a-chip (SOCs) is shown. Multiple SOCs 100 and 170A-N, with SOCs 170A-N representative of any number and type of SOCs. It is noted that SOCs 170A-N may include the components of SOC 100 in a similar arrangement in one embodiment. In another embodiment, SOCs 170A-N may include other types of components in other suitable arrangements. While the components shown within SOC 100 are meant to represent one possible composition of a SOC, it should be understood that this is merely representative of one embodiment. In other embodiments, other types of SOCs with other configurations may be employed.

SOC 100 is shown coupled to a memory 135. As implied by the name, the components of the SOC 100 may be integrated onto a single semiconductor substrate as an integrated circuit "chip". It is noted that for the purposes of this disclosure, the terms "chip" and "die" may be used interchangeably. In some embodiments, the components may be implemented on two or more discrete chips in a system. However, the SOC 100 will be used as an example herein. In the illustrated embodiment, the components of the SOC 100 include a central processing unit (CPU) complex 120, on-chip peripheral components 140A-140B (more briefly, "peripherals"), a memory controller (MC) 130, a video encoder 150 (which may itself be considered a peripheral component), a power manager and clock generation unit 165, and a communication fabric 110. The components 120, 130, 140A-140B, and 150 may all be coupled to the communication fabric 110. The memory controller 130 may be coupled to the memory 135 during use, and the peripheral 140B may be coupled to an external interface 160 during use. In the illustrated embodiment, the CPU complex 120 includes one or more processors (P) 124 and a level two (L2) cache 122.

In one embodiment, the power manager and clock generation unit 165 is coupled to a global clock stop trigger signal which is also connected to SOCs 170A-N. The global clock stop trigger signal is pulled high via resistor 180 connected to the supply voltage (VCC). When any of SOCs 100 or 170A-N detect a local clock stop trigger, the SOC asserts the global clock stop trigger signal (e.g., by pulling it low) to notify the other SOCs. All of the SOCs will then halt their local clocks in response to being notified. This allows for a fast, asynchronous clock stop trigger to be implemented across multiple SOCs. In one embodiment, the existence of multiple semiconductor dies of SOCs 170A-N is transparent to software executing on system 100. The global clock stop trigger signal facilitates capture of SOC state throughout the single system by ensuring that the clocks are stopped in a rapid manner on the multiple semiconductor dies of SOCs 170A-N in response to the detection of a local trigger on any of SOCs 170A-N.

For example, if SOC 100 detects a local clock stop trigger, SOC 100 will stop generation of a first clock (and one or more other clocks) on SOC 100 while also pulling the global clock stop trigger signal low. SOCs 170A-N will detect global clock stop trigger signal going low and stop their local clocks in a relatively fast manner since the global clock stop trigger signal is not synchronized by the detection circuitry of SOCs 170A-N. For example, when SOC 170A stops a second clock (local to SOC 170A) in response to detection of the global clock stop trigger signal going low, the second clock will be stopped within a single second clock period of the first clock being stopped. More details on this mechanism will be provided throughout the remainder of this disclosure.

The peripherals 140A-140B may be any set of additional hardware functionality included in the SOC 100. For example, the peripherals 140A-140B may include video peripherals such as an image signal processor configured to process image capture data from a camera or other image sensor, display controllers configured to display video data on one or more display devices, graphics processing units (GPUs), video encoder/decoders, scalers, rotators, blenders, etc. The peripherals may include audio peripherals such as microphones, speakers, interfaces to microphones and speakers, audio processors, digital signal processors, mixers, etc. The peripherals may include peripheral interface controllers for various interfaces 160 external to the SOC 100 (e.g. the peripheral 140B) including interfaces such as Universal Serial Bus (USB), peripheral component interconnect (PCI) including PCI Express (PCIe), serial and parallel ports, etc. The peripherals may include networking peripherals such as media access controllers (MACs). Any set of hardware may be included.

In one embodiment, SOC 100 may include at least one instance of a video encoder 150 component. Video encoder 150 may be an H.264 video encoder apparatus that may be configured to convert input video frames from an input format into H.264/Advanced Video Coding (AVC) format as described in the H.264/AVC standard. In one embodiment, SOC 100 includes CPU complex 120. The CPU complex 120 may include one or more CPU processors 124 that serve as the CPU of the SOC 100. The CPU of the system includes the processor(s) that execute the main control software of the system, such as an operating system. Generally, software executed by the CPU during use may control the other components of the system to realize the desired functionality of the system. The processors 124 may also execute other software, such as application programs. The application programs may provide user functionality, and may rely on the operating system for lower level device control. Accordingly, the processors 124 may also be referred to as application processors.

The CPU complex 120 may further include other hardware such as the L2 cache 122 and/or an interface to the other components of the system (e.g., an interface to the communication fabric 110). Generally, a processor may include any circuitry and/or microcode configured to execute instructions defined in an instruction set architecture implemented by the processor. The instructions and data operated on by the processors in response to executing the instructions may generally be stored in the memory 135, although certain instructions may be defined for direct processor access to peripherals as well. Processors may encompass processor cores implemented on an integrated circuit with other components as a system on a chip or other levels of integration. Processors may further encompass discrete microprocessors, processor cores, and/or microprocessors integrated into multichip module implementations, processors implemented as multiple integrated circuits, and so on.

The memory controller 130 may generally include the circuitry for receiving memory operations from the other components of the SOC 100 and for accessing the memory 135 to complete the memory operations. The memory controller 130 may be configured to access any type of memory 135. For example, the memory 135 may be static random access memory (SRAM), dynamic RAM (DRAM) such as synchronous DRAM (SDRAM) including double data rate (DDR, DDR2, DDR3, etc.) DRAM. Low power/mobile versions of the DDR DRAM may be supported (e.g. LPDDR, mDDR, etc.). The memory controller 130 may include queues for memory operations, for ordering (and potentially reordering) the operations and presenting the operations to the memory 135. The memory controller 130 may further include data buffers to store write data awaiting write to memory and read data awaiting return to the source of the memory operation.

The communication fabric 110 may be any communication interconnect and protocol for communicating among the components of the SOC 100. The communication fabric 110 may be bus-based, including shared bus configurations, cross bar configurations, and hierarchical buses with bridges. The communication fabric 110 may also be packet-based, and may be hierarchical with bridges, cross bar, point-to-point, or other interconnects. It is noted that the number of components of the SOC 100 (and the number of subcomponents for those shown in FIG. 1, such as within the CPU complex 120) may vary from embodiment to embodiment. There may be more or fewer of each component/subcomponent than the number shown in FIG. 1.

Figure 2:
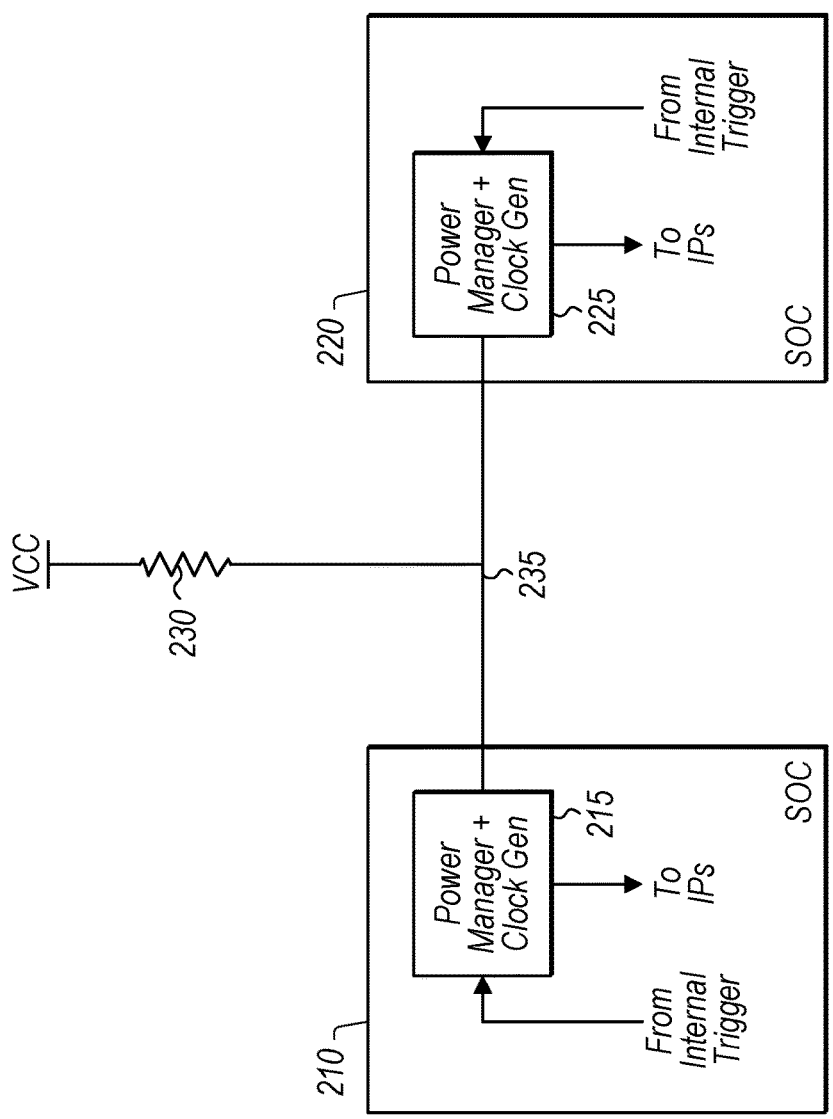
FIG. 2 is a generalized block diagram illustrating one embodiment of a multi-SOC system.

Turning to FIG. 2, an embodiment of a block diagram of a multi-SOC system 200 is illustrated. System 200 includes at least SOCs 210 and 220. In other embodiments, systems 200 may include other SOCs in addition to SOCs 210 and 220. SOC 210 includes power manager and clock generation unit 215 and any number of other components, intellectual property (IP) cores, and so on. Similarly, SOC 220 includes power manager and clock generation unit 225 and any number of other components. System 200 also includes a global clock stop trigger signal 235 which is coupled through resistor 230 to a positive supply voltage (i.e., VCC). Global clock stop trigger signal 235 serves as an indication of when a stop clock event is detected. As long as global clock stop trigger signal 235 remains deasserted, this means that none of the SOCs have detected an internal clock stop trigger event, and clock generation and data capture can continue. Alternatively, in another embodiment, global clock stop trigger signal 235 could be coupled through resistor 230 to a negative supply voltage.

In one implementation, power manager and clock generation unit 215 is coupled to one or more internal trigger sources which generate a trigger when the clocks should be stopped. For example, in one implementation, a debug halt condition may be detected, and the detection of this condition would cause an internal trigger to be generated. The type of debug halt condition that is detected can vary according to the embodiment. Multiple different debug halt conditions may be defined by the various agents in the system, with the debug halt conditions including, but not limited to, fatal error conditions, hardware fatal errors, display underruns, overflows, timeouts, latency issues, bandwidth issues, a latency counter reaching a threshold, a performance counter reaching a threshold, a first-in, first-out (FIFO) full condition, and so on. Each agent may define any number of error conditions, and these error conditions may be multiplexed together to generate a debug halt condition. A programmer may also define any number of error conditions which are also multiplexed together with the other error conditions. In one embodiment, power manager and clock generation unit 215 performs at least two actions in response to detecting the internal trigger. The first action is to stop the local clocks that are generated and supplied to the various components within SOC 210. The second action is to pull the global clock stop trigger signal 235 low. In one embodiment, the second action of pulling global clock stop trigger signal 235 low is conveyed from SOC 210 to SOC 220 without synchronization (i.e., without passing through a flip-flop).

It is noted that the first and second actions can be performed simultaneously, or in any order, such that the second action can occur before the first action in one scenario. However, in one implementation, power manager and clock generation unit 215 attempts to perform both the first action and the second action at the earliest possible moment after detecting the generation of the internal trigger. After SOC 210 pulls external signal 235 low, SOC 220 will detect the transition of external signal 235 going from high to low. When SOC 220 detects external signal 235 brought to a logic low level, power manager and clock generation unit 225 shuts off the clock(s) being generated and distributed to the circuits within SOC 220.

While the above description depicts SOC 210 detecting an internal trigger and pulling global clock stop trigger signal 235 low to alert SOC 220, the reverse scenario can also occur and responses will occur in a similar fashion. For example, if power manager and clock generation unit 225 detects an internal trigger while global clock stop trigger signal 235 is high, power manager and clock generation unit 225 will shut off the local clock(s) being generated and pull global clock stop trigger signal 235 low. When power manager and clock generation unit 215 detects external signal 235 at a logic low level, power manager and clock generation unit 215 will shut off its local clock(s) that are generated and distributed to the circuitry of SOC 210. Similarly, any number of other SOCs, integrated circuits (ICs), or other functional units may be included in system 200, and these chips, circuits, and units may also be coupled to external signal 235 and act in a similar fashion as is described for SOCs 210 and 220.

It is noted that variations to the clock stop trigger mechanism in system 200 can be implemented in other embodiments. For example, in another embodiment, external signal 235 may be kept at a logic low level during normal operation, and when an internal trigger is detected by one of the SOCs, external signal 235 would be driven to a logic high level. In a further embodiment, power manager and clock generation unit 215 is split into two or more separate units. For example, a power management unit may be implemented separately from a clock generation unit in one embodiment. This can apply to power manager and clock generation unit 225 as well.

Figure 3:
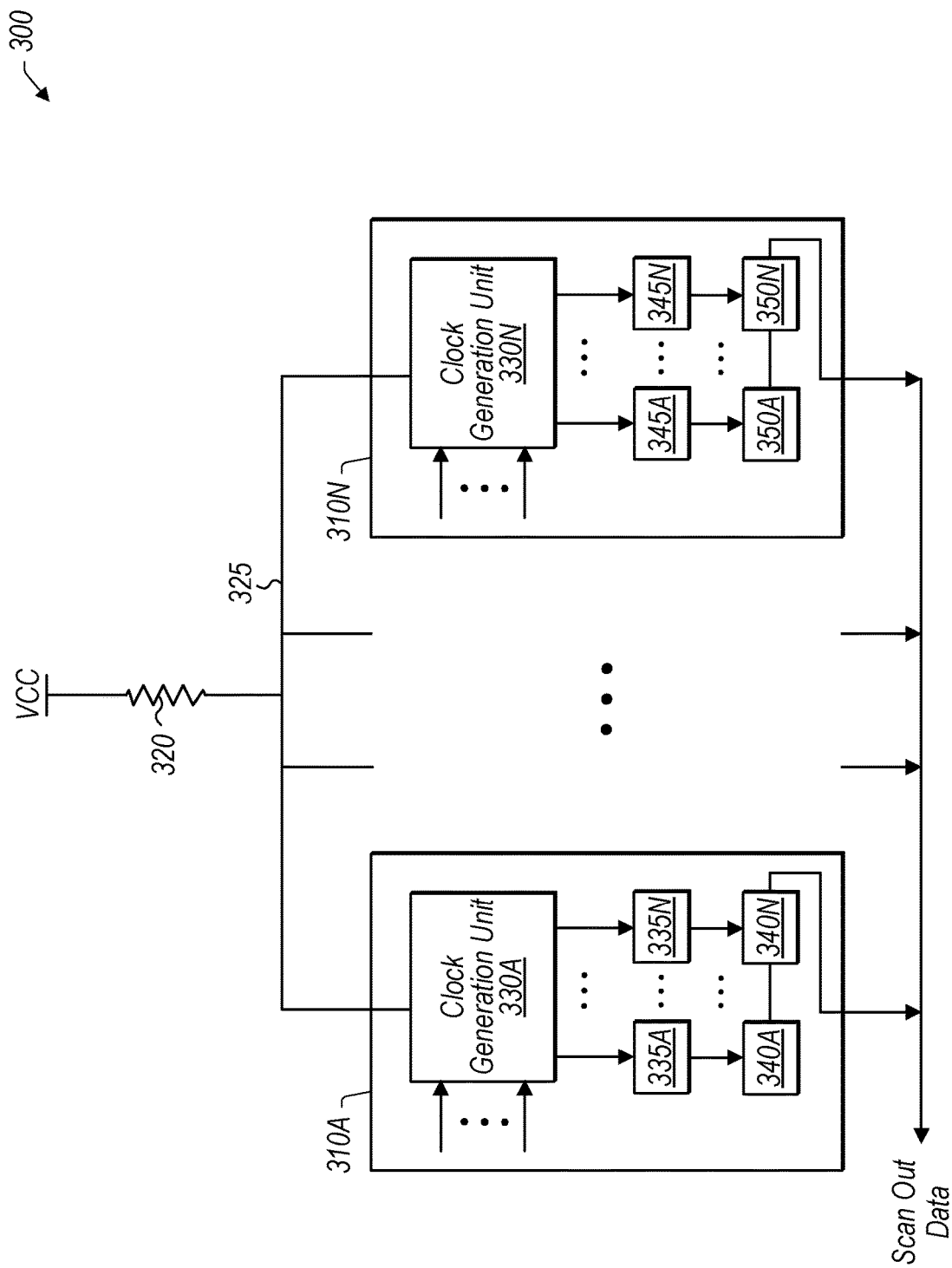
FIG. 3 is a block diagram of one embodiment of an apparatus.

Referring now to FIG. 3, a block diagram of one implementation of an apparatus 300 is shown. In one implementation, apparatus 300 includes any number of functional units 310A-N, with each functional unit 310A-N including its own clock generation unit 330A-N, respectively. Apparatus 300 may also include any number of other components (e.g., memory, voltage regulator, I/O interfaces, display controller) which are not shown to avoid obscuring the figure. In some cases, a given functional unit 310A-N may have multiple clock generation units. Also, although the blocks shown within functional units 310A-N have the same depicted structure, this is shown merely for ease of illustration and does not mean that functional units 310A-N are identical. Accordingly, it should be understood that each functional unit 310A-N can be unique and can have its own structure, number of components, arrangement of components, number and frequency of clocks, and so on. In one implementation, each functional unit 310A-N is on a separate semiconductor die. In another implementation, two or more functional units 310A-N are included on the same semiconductor die while other functional units 310A-N are on separate semiconductor dies.

As shown, functional unit 310A includes clock generation unit 330A, components 335A-N, and buffers 340A-N. Components 335A-N are representative of any number and type of components. For example, in one embodiment, components 335A-N include a processor, a memory controller, and so on. Clock generation unit 330A generates and supplies the clocks to components 335A-N. During implementation of a given debug test, components 335A-N store various data to buffers 340A-N. It is noted that apparatus 300 may also be referred to as design under test 300 during implementation of the given debug test. Buffers 340A-N are representative of any number and type of memory or storage elements. When a stop clock event is triggered, clock generation unit 330A stops the clocks provided to components 335A-N. Also, clock generation unit 330A asserts signal 325 (e.g., pulls signal 325 low), which notifies functional unit 310N (and any other functional units connected to signal 325) that they should also stop their clocks. After the clocks on all functional units 310A-N are stopped, the data stored in buffers 340A-N is scanned out and provided to a debug computer or other device or tool for analysis. In one embodiment, the data in buffers 340A-N is scanned out via a test access port (TAP) network. In one embodiment, the connection to the TAP network is implemented as a joint test action group (JTAG) interface. In other embodiments, the connection to the TAP network is implemented using other types of interfaces Similar to functional unit 310A, functional unit 310N includes clock generation unit 330N, components 345A-N, and buffers 350A-N. Functional unit 310N also monitors various stop clock event triggers local to functional unit 310N, and if any of these triggers are detected, clock generation unit 330N pulls signal 325 low to notify the other functional units. Functional unit 310N also monitors signal 325 (which is coupled through resistor 320 to a supply voltage) to detect when one of the other functional units encounters a stop clock event which would require functional unit 310N to stop its clocks.

Figure 4:
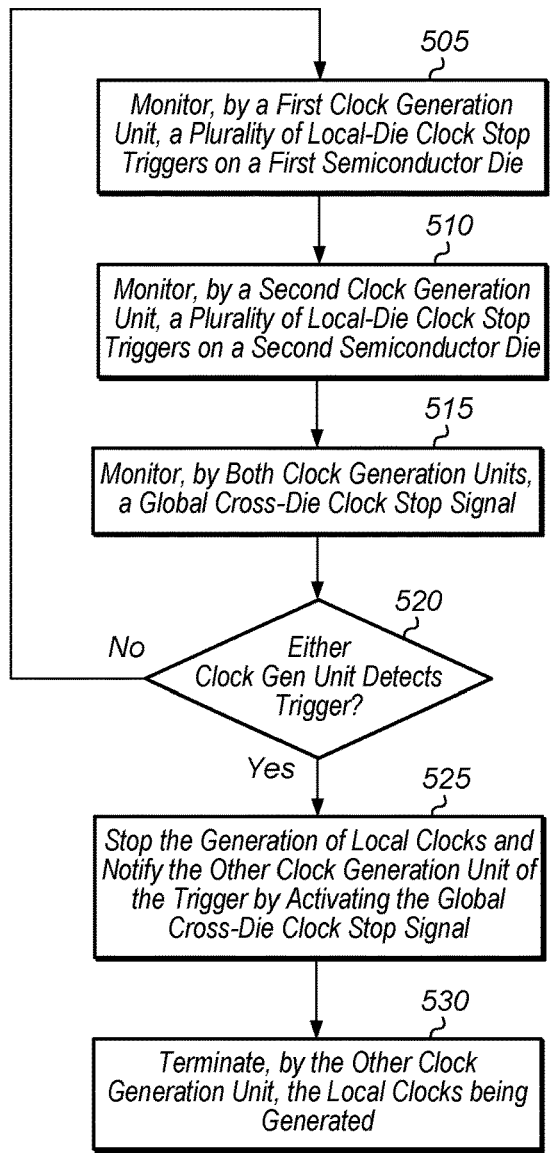
FIG. 4 is a flow diagram of one embodiment of a method for implementing a fast asynchronous multi-die clock stop trigger.

Referring now to FIG. 4, a generalized flow diagram of one embodiment of a method 400 for implementing a fast asynchronous multi-die clock stop trigger is shown. For purposes of discussion, the steps in this embodiment (as well as for FIGS. 5-6) are shown in sequential order. However, in other embodiments some steps may occur in a different order than shown, some steps may be performed concurrently, some steps may be combined with other steps, and some steps may be absent.

A first clock generation unit monitors a plurality of local-die clock stop triggers on a first semiconductor die (block 405). Each of the plurality of local-die clock stop triggers on the first semiconductor die, when triggered, are programmed to cause the immediate termination of clocks on multiple semiconductor dies. A second clock generation unit monitors a plurality of local-die clock stop triggers on a second semiconductor die (block 410). Similar to the first semiconductor die's local triggers, upon being triggered, each of the plurality of local-die clock stop triggers on the second semiconductor die are programmed to cause the immediate termination of clocks on multiple semiconductor dies. Both clock generation units monitor a global cross-die clock stop signal (block 415). It is noted that blocks 405, 410, and 415 can be performed concurrently. It is also noted that while method 400 describes two separate clock generation units on two separate semiconductor dies, this is merely representative of one embodiment. In other embodiments, there may be three or more clock generation units on three separate semiconductor dies all monitoring the global cross-die clock stop signal in addition to their local-die clock stop triggers.

If either clock generation unit detects a local-die clock stop trigger being activated (conditional block 420, "yes" leg), then the respective clock generation unit stops the generation of local clocks and notifies the other clock generation unit by activating the global cross-die clock stop signal (block 425). Stopping the generation of local clocks effectively halts the collection of data on the semiconductor die. In one embodiment, activating the global cross die clock stop signal is achieved by driving the signal low. In another embodiment, activating the global cross die clock stop signal involves driving the signal high. In a further embodiment, activating the global cross die clock stop signal is achieved by sending a pulse on the corresponding connection (e.g., trace, wire). In other embodiments, other ways of activating the global cross die clock stop signal can be employed.

When the other clock generation unit detects the global cross die clock stop signal being activated, the other clock generation unit terminates the local clocks being generated (block 430). After block 430, method 400 ends. It is noted that after method 400 ends, data can be retrieved from the first and/or second semiconductor dies and provided to an analysis tool (e.g., external computer) after the clocks are stopped. For example, the data can be retrieved from the first and/or second semiconductor dies and stored in a storage medium accessible by the analysis tool. In one embodiment, this data is generated as part of a debug test involving the first and second semiconductor dies. In other embodiments, the retrieved data is associated with other types of scenarios.

Figure 5:
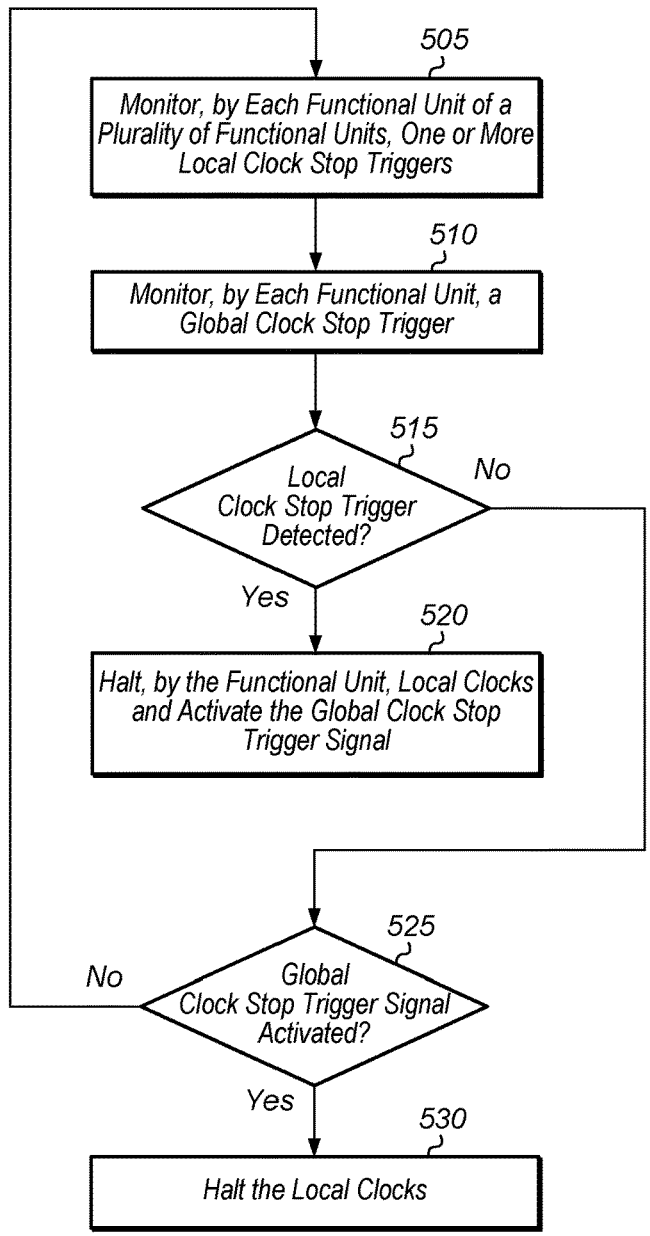
FIG. 5 is a flow diagram of one embodiment of a method for a functional unit implementing a clock stop trigger.

Turning now to FIG. 5, one embodiment of a method 500 for a functional unit implementing a clock stop trigger is shown. Each functional unit of a plurality of functional units monitors one or more local clock stop triggers (block 505). In one embodiment, each functional unit has its own clock domain. In other words, each separate functional unit has a clock domain different from the other functional units. As used herein, the term "clock domain" is defined as a portion of circuitry that is driven by either a single clock or clocks that have a constant phase relationship over time. In cases where multiple components are connected together within a single clock domain, then these multiple components will be considered to be a single functional unit for the purpose of the discussion of method 500.

Each functional unit of the plurality of functional units also monitors a global clock stop trigger signal (block 510). If a local clock stop trigger is detected (conditional block 515, "yes" leg), then the functional unit halts the local clocks and activates the global clock stop trigger signal (block 520). After block 520, method 500 ends. When the other functional units detect the activated global clock stop trigger signal, they will halt their local clocks. If a local clock stop trigger is not detected (conditional block 515, "no" leg), but if the functional unit detects that the global clock stop trigger signal is activated (conditional block 525, "yes" leg), then the functional unit halts the local clocks (block 530). After block 530, method 500 ends.

Figure 6:
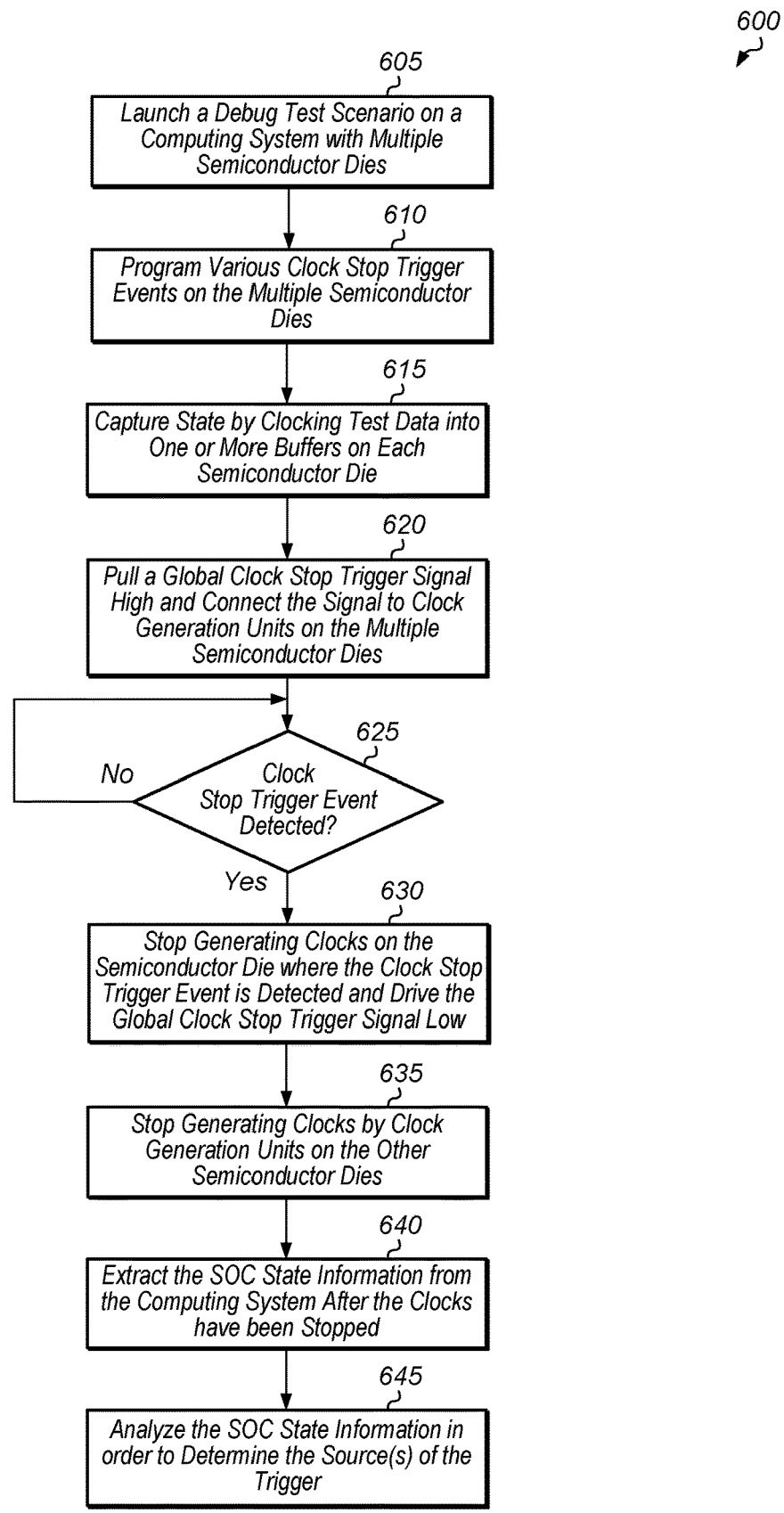
FIG. 6 is a flow diagram of one embodiment of a method for running a debug test scenario on a computing system with multiple semiconductor dies.

Referring now to FIG. 6, one embodiment of a method 600 for running a debug test scenario on a computing system with multiple semiconductor dies is shown. A debug test scenario is launched on a computing system with multiple semiconductor dies (block 605). Prior to starting the debug test scenario, various clock stop trigger events are programmed on the multiple semiconductor dies (block 610). During the debug test scenario, state is captured by clocking test data into one or more buffers on each semiconductor die (block 615). Additionally, a global clock stop trigger signal is pulled high and connected to clock generation units on the multiple semiconductor dies (block 620). If a clock stop trigger event is detected by a semiconductor die (conditional block 625, "yes" leg), then the clock generation unit on the semiconductor die where the clock stop trigger event was detected stops generating clocks and the global clock stop trigger signal is driven low (block 630). When the clock generation units on the other semiconductor dies detect the global clock stop trigger signal having a logic low level, the clock generation units stop generating clocks on their respective semiconductor dies (block 635).

Next, SOC state information is extracted from the computing system after the clocks have been stopped (block 640). In one embodiment, the SOC state information is extracted via a scan dump. A scan dump refers to configuring flip-flops as shift registers (i.e., a scan chain) and using a scan clock to shift out the data stored in the flip-flops. In another embodiment, the SOC state information is extracted via a memory dump, which involves retrieving the contents of one or more memory devices. In other embodiments, the SOC state information is extracted using other techniques. Then, the SOC state information is analyzed to determine the source(s) of the trigger (block 645). After block 645, method 600 ends. After the source(s) and/or cause(s) of the trigger are determined, a new debug test scenario can be generated and method 600 can be repeated with the new debug test scenario.

Figure 7:
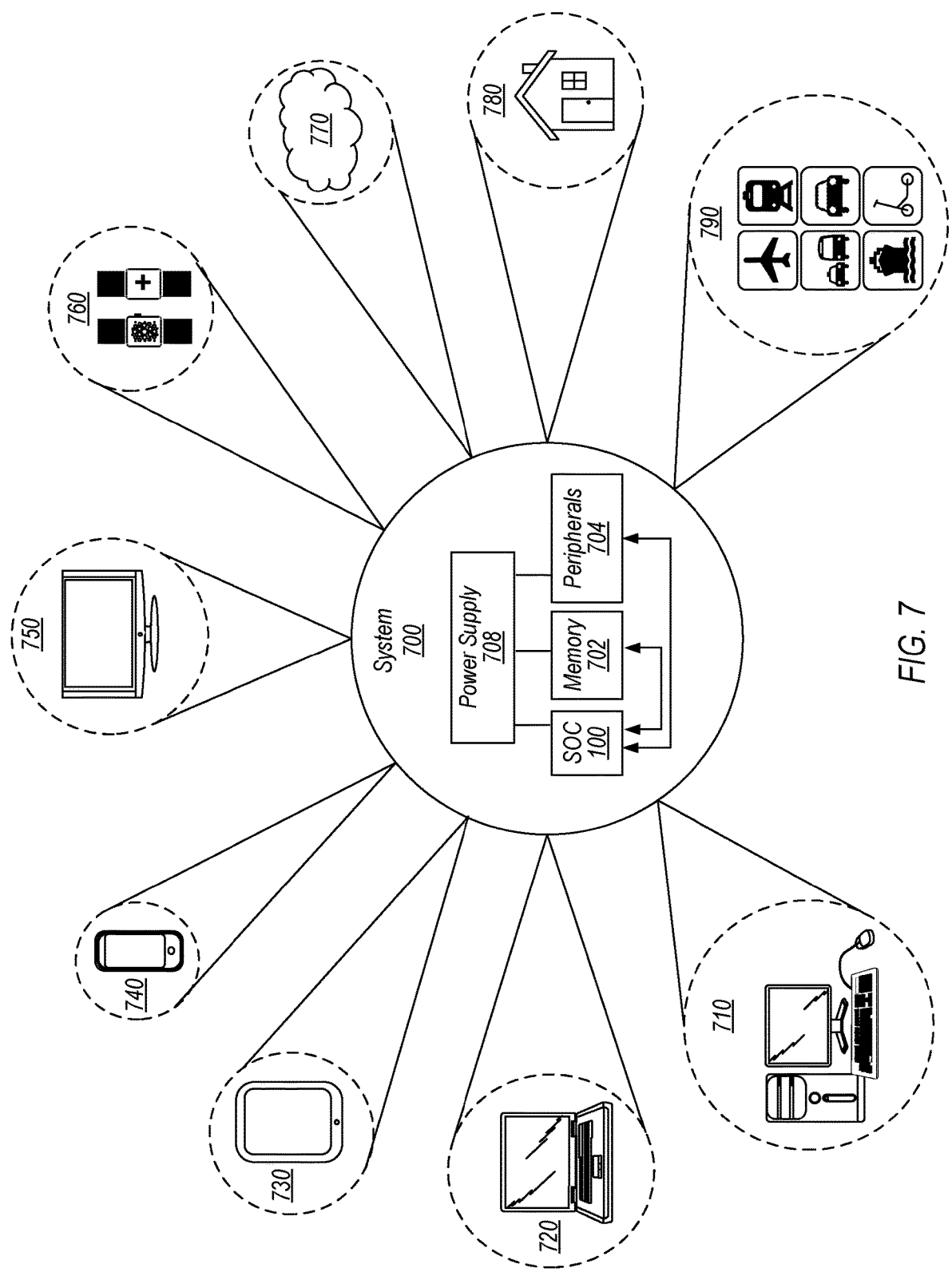
FIG. 7 is a block diagram of one embodiment of a system.

Referring now to FIG. 7, a block diagram of one embodiment of a system 700 is shown that may incorporate and/or otherwise utilize the methods and mechanisms described herein. In the illustrated embodiment, the system 700 includes at least a portion of SOC 100 (of FIG. 1) which may include multiple types of processing units, such as a central processing unit (CPU), a graphics processing unit (GPU), or otherwise, a communication fabric, and interfaces to memories and input/output devices. In various embodiments, SOC 100 is coupled to external memory 702, peripherals 704, and power supply 708.

A power supply 708 is also provided which supplies the supply voltages to SOC 100 as well as one or more supply voltages to the memory 702 and/or the peripherals 704. In various embodiments, power supply 708 represents a battery (e.g., a rechargeable battery in a smart phone, laptop or tablet computer, or other device). In some embodiments, more than one instance of SOC 100 is included (and more than one external memory 702 may be included as well).

The memory 702 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices are mounted with a SOC or an integrated circuit in a chip-on-chip configuration, a package-on-package configuration, or a multi-chip module configuration.

The peripherals 704 include any desired circuitry, depending on the type of system 700. For example, in one embodiment, peripherals 704 includes devices for various types of wireless communication, such as wifi, Bluetooth, cellular, global positioning system, etc. In some embodiments, the peripherals 704 also include additional storage, including RAM storage, solid state storage, or disk storage. The peripherals 704 include user interface devices such as a display screen, including touch display screens or multi-touch display screens, keyboard or other input devices, microphones, speakers, etc.

As illustrated, system 700 is shown to have application in a wide range of areas. For example, system 700 may be utilized as part of the chips, circuitry, components, etc., of a desktop computer 710, laptop computer 720, tablet computer 730, cellular or mobile phone 740, or television 750 (or set-top box coupled to a television). Also illustrated is a smartwatch and health monitoring device 760. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 700 may further be used as part of a cloud-based service(s) 770. For example, the previously mentioned devices, and/or other devices, may access computing resources in the cloud (i.e., remotely located hardware and/or software resources). Still further, system 700 may be utilized in one or more devices of a home 780 other than those previously mentioned. For example, appliances within the home 780 may monitor and detect conditions that warrant attention. For example, various devices within the home 780 (e.g., a refrigerator, a cooling system, etc.) may monitor the status of the device and provide an alert to the homeowner (or, for example, a repair facility) should a particular event be detected. Alternatively, a thermostat may monitor the temperature in the home 780 and may automate adjustments to a heating/cooling system based on a history of responses to various conditions by the homeowner. Also illustrated in FIG. 7 is the application of system 700 to various modes of transportation 790. For example, system 700 may be used in the control and/or entertainment systems of aircraft, trains, buses, cars for hire, private automobiles, waterborne vessels from private boats to cruise liners, scooters (for rent or owned), and so on. In various cases, system 700 may be used to provide automated guidance (e.g., self-driving vehicles), general systems control, and otherwise. These and many other embodiments are possible and are contemplated. It is noted that the devices and applications illustrated in FIG. 7 are illustrative only and are not intended to be limiting. Other devices are possible and are contemplated.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
a first semiconductor die comprising circuitry configured to:
activate a global clock stop trigger signal responsive to detection of a first trigger, wherein the first trigger is local to the first semiconductor die, and wherein triggering of the first trigger is programmed to cause multiple semiconductor dies to immediately terminate clock generation;
stop a first clock on the first semiconductor die and halt collection of first data on the first semiconductor die responsive to detection of the first trigger; and
a second semiconductor die comprising circuitry configured to:
monitor the global clock stop trigger signal;
stop a second clock on the second semiconductor die and halt collection of second data on the second semiconductor die responsive to detection of the global clock stop trigger signal being activated;
wherein the apparatus is configured to store the first and second data in a storage medium accessible by an analysis tool responsive to detection of the global clock stop trigger signal being activated.

2. The apparatus as recited in claim 1, wherein the first and second semiconductor dies are configured as a single system in which an existence of multiple semiconductor dies is transparent to software executing on the single system, and wherein the global clock stop trigger signal is configured to facilitate capture of software state throughout the single system.

3. The apparatus as recited in claim 1, wherein the circuitry of the second semiconductor die is further configured to:
activate the global clock stop trigger signal responsive to detection of a second trigger, wherein the second trigger is local to the second semiconductor die, and wherein triggering of the second trigger is programmed to cause the first and second semiconductor dies to immediately terminate clock generation; and
stop the second clock and halt collection of the second data responsive to detecting the second trigger.

4. The apparatus as recited in claim 1, wherein the circuitry of the first semiconductor die is further configured to activate the global clock stop trigger signal by driving the global clock stop trigger signal to a logic low level, and wherein the global clock stop trigger signal is coupled to a supply voltage via a resistor.

5. The apparatus as recited in claim 1, wherein the circuitry of the second semiconductor die comprises a clock generation ciruit configured to stop generating the second clock responsive to detection of the global clock stop trigger signal being activated.

6. The apparatus as recited in claim 5, wherein the circuitry of the second semiconductor die comprises a scan chain of flip-flops clocked by the second clock, and wherein the second clock is stopped by the clock generation circuit within a single second clock period after the first clock is stopped on the first semiconductor die.

7. The apparatus as recited in claim 1, wherein the global clock stop trigger signal is conveyed to the second semiconductor die without synchronization.

8. A method comprising:
activating, by circuitry on a first semiconductor die, a global clock stop trigger signal responsive to detection of a first trigger, wherein the first trigger is local to the first semiconductor die, and wherein triggering of the first trigger is programmed to cause multiple semiconductor dies to immediately terminate clock generation;
stopping, by the circuitry on the first semiconductor die, a first clock on the first semiconductor die and halt collection of first data on the first semiconductor die responsive to detection of the first trigger;
monitoring, by circuitry on a second semiconductor die, the global clock stop trigger signal;
stopping, by the circuitry on the second semiconductor die, a second clock on the second semiconductor die and halt collection of second data on the second semiconductor die responsive to detection of the global clock stop trigger signal being activated; and
storing the first and second data in a storage medium accessible by an analysis tool responsive to detection of the global clock stop trigger signal being activated.

9. The method as recited in claim 8, wherein the first and second semiconductor dies are configured as a single system in which an existence of multiple semiconductor dies is transparent to software executing on the single system, and wherein the global clock stop trigger signal is configured to facilitate capture of software state throughout the single system.

10. The method as recited in claim 8, further comprising:
activating, by the circuitry of the second semiconductor die, the global clock stop trigger signal responsive to detection of a second trigger, wherein the second trigger is local to the second semiconductor die, and wherein triggering of the second trigger is programmed to cause the first and second semiconductor dies to immediately terminate clock generation; and
stopping the second clock and halt collection of the second data responsive to detecting the second trigger.

11. The method as recited in claim 8, further comprising activating, by the circuitry of the first semiconductor die, the global clock stop trigger signal by driving the global clock stop trigger signal to a logic low level, and wherein the global clock stop trigger signal is coupled to a supply voltage via a resistor.

12. The method as recited in claim 8, further comprising a clock generation circuit stopping generating the second clock responsive to detection of the global clock stop trigger signal being activated.

13. The method as recited in claim 12, further comprising stopping, by the clock generation circuit, the clock generation circuit within a single second clock period after the first clock is stopped on the first semiconductor die.

14. The method as recited in claim 8, further comprising conveying the global clock stop trigger signal to the second semiconductor die without synchronization.

15. A system comprising:
a first clock generation circuit configured to:
activate a global clock stop trigger signal responsive to detecting a first trigger;
stop a first clock and halt collection of first data responsive to detection of the first trigger; and
a second clock generation circuit configured to:
monitor the global clock stop trigger signal;
stop a second clock and halt collection of second data responsive to detection of the global clock stop trigger signal being activated;
wherein the system is configured to store the first and second data in a storage medium accessible by an analysis tool responsive to detection of the global clock stop trigger signal being activated.

16. The system as recited in claim 15, wherein the second clock generation circuit is further configured to:
   activate the global clock stop trigger signal responsive to detection of a second trigger; and
   stop the second clock and halt collection of the second data responsive to detection of the second trigger.

17. The system as recited in claim 15, wherein the first clock generation circuit is further configured to activate the global clock stop trigger signal by driving the global clock stop trigger signal to a logic low level.

18. The system as recited in claim 17, wherein the global clock stop trigger signal is coupled to a supply voltage via a resistor.

19. The system as recited in claim 15, wherein the first clock generation circuit is further configured to activate the global clock stop trigger signal by driving the global clock stop trigger signal to a logic high level.

20. The system as recited in claim 15, wherein the global clock stop trigger signal is coupled to a ground voltage via a resistor.

* * * * *

UNITED STATES PATENT AND TRADEMARK OFFICE
CERTIFICATE OF CORRECTION

PATENT NO. : 11,422,184 B1
APPLICATION NO. : 17/230443
DATED : August 23, 2022
INVENTOR(S) : Fleckenstein et al.

It is certified that error appears in the above-identified patent and that said Letters Patent is hereby corrected as shown below:

In the Claims

Column 15, Claim 5, Line 51, please delete "ciruit" and insert -- circuit --.

Signed and Sealed this
Fourth Day of October, 2022

Katherine Kelly Vidal
*Director of the United States Patent and Trademark Office*